United States Patent
Spadaccia

(10) Patent No.: US 11,539,308 B2
(45) Date of Patent: Dec. 27, 2022

(54) VIRTUAL RESISTIVE LOAD IN FEEDBACK LOOP DRIVING A PIEZOELECTRIC ACTUATOR

(71) Applicant: Advanced Energy Industries, Inc., Fort Collins, CO (US)

(72) Inventor: Lawrence Spadaccia, Lockport, NY (US)

(73) Assignee: Advanced Energy Industries, Inc., Denver, CO (US)

(*) Notice: Subject to any disclaimer, the term of this patent is extended or adjusted under 35 U.S.C. 154(b) by 910 days.

(21) Appl. No.: 16/400,821

(22) Filed: May 1, 2019

(65) Prior Publication Data
US 2020/0350837 A1    Nov. 5, 2020

(51) Int. Cl.
| | | |
|---|---|---|
| H02N 2/06 | (2006.01) | |
| H01L 41/04 | (2006.01) | |
| H01L 41/09 | (2006.01) | |

(52) U.S. Cl.
CPC .......... *H02N 2/062* (2013.01); *H01L 41/042* (2013.01); *H01L 41/09* (2013.01); *H02N 2/065* (2013.01)

(58) Field of Classification Search
CPC ....... H01L 41/042; H01L 41/09; H02N 2/062; H02N 2/065
USPC ......................................................... 310/317
See application file for complete search history.

(56) References Cited

U.S. PATENT DOCUMENTS

| | | |
|---|---|---|
| 4,263,527 A | 4/1981 | Comstock |
| 6,340,858 B1 | 1/2002 | Jaenker |
| 2012/0046765 A1* | 2/2012 | Nikolic ................. B06B 1/0253 |
| | | 700/90 |

FOREIGN PATENT DOCUMENTS

JP    2013162577 A    8/2013

OTHER PUBLICATIONS

Wienema, David, "International Search Report and Written Opinion Regarding International Application No. PCT/US2020/031123", dated Aug. 17, 2020, p. 52, Published in: NL.

Fleming, A. J., Charge Drive With Active DC Stabilization for Linearization of Piezoelectric Hysteresis, IEEE, Transactions of Ultrasonics, Ferroelectrics, and Frequency Control, 60(8):1630-1637 Aug. 2013 (8 pages).

(Continued)

*Primary Examiner* — Derek J Rosenau
(74) *Attorney, Agent, or Firm* — Neugeboren O'Dowd PC

(57) ABSTRACT

A virtual resistive load feedback circuit for driving a piezoelectric actuator is provided that accounts for a hysteresis error and drift within the movement of the actuator. The circuit may include a voltage divider and charge divider. A voltage monitor signal corresponding to a voltage of a driver signal and a current monitor signal corresponding to a current provided to the amplifier are combined by an operational amplifier and include electrical characteristics of the actuator such that the circuit approximates a virtual load across the actuator. A feedback portion of the operational amplifier may include a resistor and capacitor connected in parallel to provide the voltage and charge divide functions. The use of the virtual resistive circuit allows for the piezoelectric actuator to be ground referenced, with no external components connected directly to the actuator while gaining the feedback effect to counter the hysteresis and drifts errors of the actuator.

13 Claims, 6 Drawing Sheets

(56) References Cited

OTHER PUBLICATIONS

Noras, M. A. et al., The Design of a High-Voltage Charge-Feedback Piezoamplifier, 1th International Conference on New Actuators, Jun. 14-16, 2006 (3 pages).
Noras, M. A. et al., A Charge Feedback Controller for a Piezoelectric Voltage Amplifier/Driver, Mater. Res. Soc. Symp. Proc. vol. 969, 2017 (5 pages).

* cited by examiner

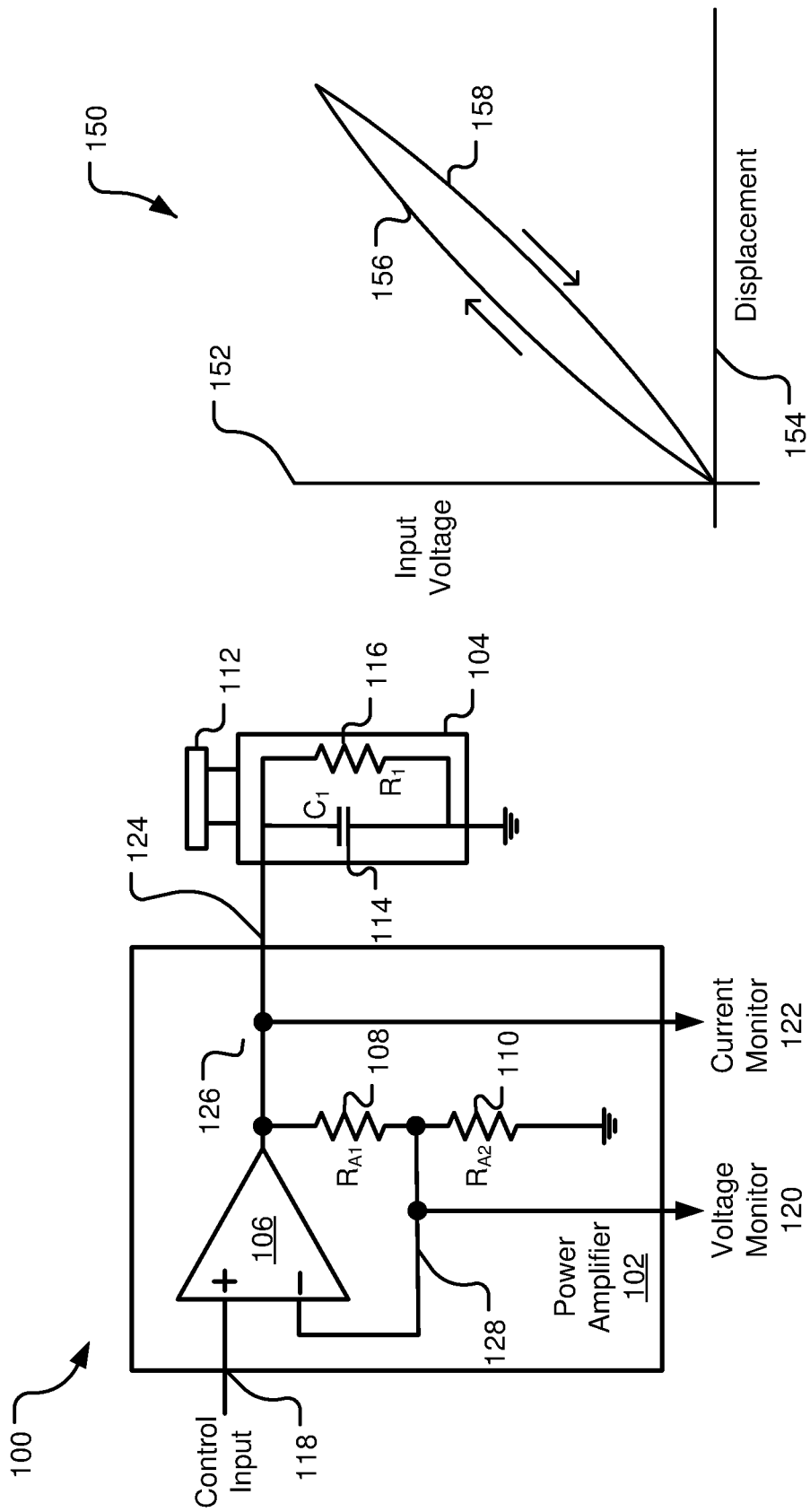

VIRTUAL RESISTIVE LOAD IN FEEDBACK
LOOP DRIVING A PIEZOELECTRIC
ACTUATOR

TECHNICAL FIELD

Aspects of the present disclosure relate to power sources and, in particular, to drivers or power sources of piezoelectric actuators and devices utilizing feedback techniques.

BACKGROUND

The piezoelectric effect is the linear displacement of a piezoelectric material, usually a type of crystal or ceramic material, when an electrical signal is applied to the material. For example, the application of a positive voltage may cause the material to expand and compression of the material may occur when a negative voltage is applied. In some applications, a piezoelectric material may be placed between two conductive plates and an electric field, usually a voltage source, is applied to the plates to control the displacement of the material. Given the applied electrical field, the piezoelectric material produces a corresponding strain or displacement of the material, usually in the range of nanometers, in the direction of the applied voltage. The direction or displacement with respect to the voltage potential can be manipulated by poling the piezoelectric material.

Piezoelectric actuators or transducers therefore may convert an electrical signal applied to a piezoelectric material into a precisely controlled physical displacement or stroke of the actuator. Such actuators may be used for movement or adjustments to machining or other precision tools, lenses, mirrors, or other equipment and applications requiring micro- or nano-positioning. Present practical applications for piezoelectric actuators include a displacement range or stroke for a given applied voltage range and the composition or assembly (sometimes series stacked) allow for wide ranges of displacement and voltages. For example, 0 to 100 volts may displace a piezoelectric stack actuator from 0 to 10 micro-meters.

Using the applied voltage value to determine the expected displacement is a workable method for controlling and positioning a device attached to the piezoelectric material. Unfortunately, the ratio of applied voltage to the displacement is not exactly linear. Stated differently, displacement of the piezoelectric actuator does not change consistently with changes in applied voltage. This error, known as nonlinearity, hysteresis, or creepage, reduces the preciseness of control of the movement of the piezoelectric actuator and, correspondingly, any tool or device utilizing the piezoelectric actuator to move.

It is with these observations in mind, among others, that aspects of the present disclosure were conceived.

SUMMARY

According to one aspect, a power driving circuit includes an amplifier comprising a first input and a second input, the first input receiving a control input signal and the amplifier transmitting, based on the control input signal, a power driving signal to a piezoelectric actuator device and a hysteresis compensation circuit. The hysteresis compensation circuit comprises a summing circuit comprising a first input receiving a voltage monitor signal comprising a first voltage value corresponding to a voltage of the power driving signal and a current monitor signal comprising a second voltage value corresponding to a current of the power driving signal, the output comprising the sum of the voltage monitor signal and the current monitor signal and a capacitance dividing circuit, coupled between the output of the summing circuit and the first input of the summing circuit, wherein the output of the summing circuit is coupled to the second input of the amplifier for hysteresis compensation of the piezoelectric actuator device based at least on the voltage monitor output signal and the current monitor output signal According to another aspect, a method comprising amplifying, by a power amplifier, a voltage of a control input signal to drive a piezoelectric actuator device, the drive signal comprising a drive voltage and a drive current and generating, by the power amplifier, a drive voltage monitor signal corresponding to the drive voltage and a drive current monitor signal corresponding to the drive current is provided. The method also includes transmitting, from a virtual resistive load feedback circuit and to the piezoelectric actuator device, a hysteresis compensation feedback signal to the power amplifier for hysteresis compensation of the piezoelectric actuator device based at least on the drive voltage monitor signal and the drive current monitor signal.

According to yet another aspect, a system for hysteresis compensation of a piezoelectric actuator is provided. The system comprises an operational amplifier comprising a first input receiving a voltage monitor signal of a power amplifier and a current monitor signal of the power amplifier, the power amplifier receiving a control input signal and providing a power driving signal to a load, the voltage monitor signal comprising a first voltage value corresponding to a voltage of the power driving signal and the current monitor signal comprising a second voltage value corresponding to a current of the power driving signal, a second input coupled to a common value, and an output coupled to a feedback input of the power amplifier, the output comprising a summation of the voltage monitor signal and the current monitor signal. The system also includes a feedback circuit, coupled between the output of the operational amplifier and the first input, comprising a first resistor connected in parallel with a capacitor, the feedback circuit dividing the voltage and the current of the power driving signal.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. The drawings depict only typical embodiments of the present disclosure and, therefore, are not to be considered limiting in scope.

FIG. 1A illustrates a first example voltage amplifier driver circuit for a piezoelectric actuator.

FIG. 1B is a graph illustrating displacement versus input voltage of the piezoelectric actuator of FIG. 1A.

DETAILED DESCRIPTION

Figures 2A, 2B:
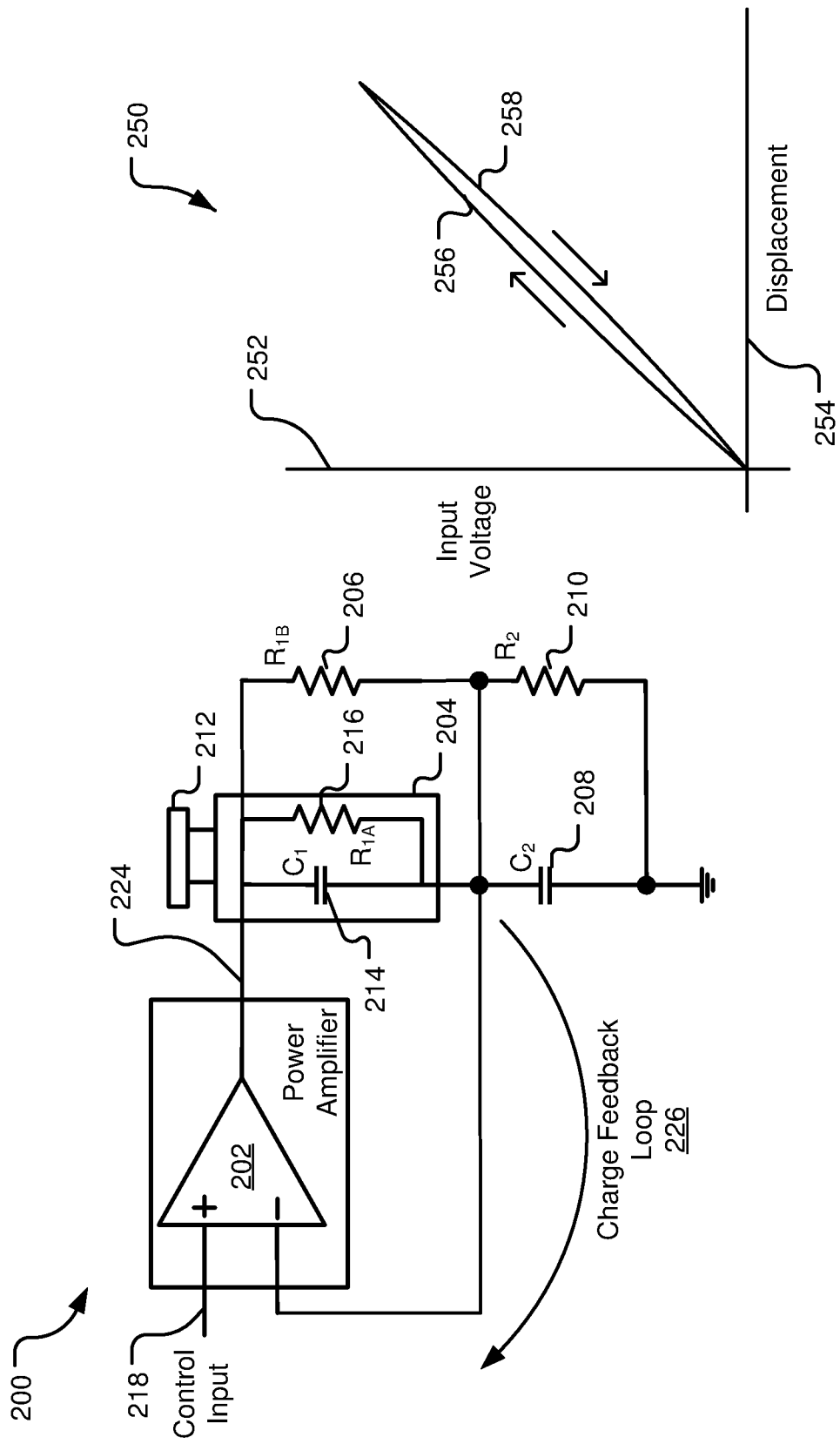
FIG. 2A illustrates a second example voltage amplifier driver circuit for a piezoelectric actuator with a floating-load charge feedback.
FIG. 2B is a graph illustrating displacement versus input voltage of the piezoelectric actuator of FIG. 2A.

Embodiments of the present disclosure provide for a virtual resistive load feedback circuit for driving a piezoelectric actuator. Use of a virtual resistive load with a piezoelectric amplifier provides a way to overcome conventional hysteresis errors, and more precisely control movement of the actuator. Although some of the effects of hysteresis error may be accounted for in a power amplifier driver that uses a floating-load charge feedback, such drivers include other negative effects, like high power dissipation and the use of bulky devices that make the drivers inadequate for some applications. The voltage amplifier driver circuit for a piezoelectric actuator with a virtual resistive load feedback described herein provides the hysteresis error correction when driving a piezoelectric actuator, while reducing the power dissipation and device constraints of previous solutions. In particular, the amplifier driver circuit with a virtual resistive load feedback may include a voltage divider circuit and charge divider circuit. A voltage monitor signal corresponding to a voltage of a driver signal to the piezoelectric amplifier and a current monitor signal corresponding to a current provided to the amplifier may be utilized by the virtual resistive load feedback circuit. These signals may be combined by an operational amplifier and may include electrical characteristics of the piezoelectric actuator such that the virtual resistive load feedback circuit approximates a virtual load across the piezoelectric actuator.

A feedback circuit of the operational amplifier may include a resistor and capacitor connected in parallel to provide the voltage and charge divide functions of the circuit. By using the operational amplifier and voltage and current monitors to generate the virtual resistor, the piezoelectric actuator can be ground referenced, with no external components connected directly to the actuator while gaining the feedback effect to counter the hysteresis and drift errors of the actuator. This implementation may provide a more precise control and better accuracy of the piezoelectric actuator by correcting a low voltage control input signal to the power amplifier to compensate for the change in the piezoelectric voltage to displacement transfer function. In some implementations, the values of some components may be adjusted manually or through a computing device to provide for precise correction of the feedback signal.

FIG. 1A illustrates a first example circuit 100 including a voltage amplifier driver 102 for controlling a piezoelectric actuator 104. In general, the voltage amplifier driver circuit 102, or power amplifier, receives a control input signal 118 with a control voltage and amplifies the control voltage to generate a driver voltage signal 124. Piezoelectric actuators 104 may require a large range and relative large voltage signal for control of the actuator device, such as between 0 to 1000 volt signals. In one example, the power amplifier 102 may include a gain of ×100 such that the power amplifier amplifies a control signal 118 of 10 volts, for example, a 1000 volt control signal 124 to drive the expansion or contraction of the piezoelectric actuator 104. The gain (×100) of the power amplifier 102 may be used to generate the large voltage needed to control the precise movement of the actuator 104. The power amplifier 102 may include any gain as needed to power a piezoelectric actuator 104.

In one example, the power amplifier 102 includes an operational amplifier 106 receiving the control input voltage 118 at a first input. The op amp 106 amplifies the input voltage 118 to the driving voltage 124. A feedback loop is coupled with a second input of the operational amplifier. In the feedback loop, a first end of a first resistor 108 ($R_{A1}$) is coupled to the output of the op amp 106, with the second end of the resistor coupled to a second input of the op amp. A feedback signal 128 is provided to the op amp by way of the feedback loop. A first end of a second resistor 110 ($R_{A2}$) is also coupled to the second end of resistor $R_{A1}$ 108 to form a voltage divider circuit, with a second end of the second resistor $R_{A2}$ connected to ground. Although the power amplifier 102 is illustrated in FIG. 1A as including an op amp 106 and two resistors 108, 110, any number and type of components may also be included in the power amplifier 102 to amplify an input voltage 118 to a driver voltage 124. The power amplifier 102 in FIG. 1A is provided for simplicity to illustrate a typical power amplifier to drive a piezoelectric actuator device 104.

The power amplifier 102 may also provide one or more monitor signals 120, 122 associated with the amplification of the control signal 118. For example, power amplifier 102 may provide a voltage monitor signal 120 from the feedback 128 to the op amp 106. Depending on the values of the resistors 108, 110 in the voltage divider portion of the power amplifier 102, the voltage monitor 120 signal includes a voltage that is less than the driving voltage 124 ($V_{DRIVE}$) output of the amplifier. For example, voltage monitor 120 ($V_{Mon}$) may equal:

$$V_{MON} = \left(\frac{R_{A2}}{R_{A1} + R_{A2}}\right) * V_{Drive} \qquad (1)$$

Through the selection of the values of resistor $R_{A1}$ 108 and resistor $R_{A2}$ 110, the voltage monitor signal 120 may correspond to the driver voltage 124, but may be at a lower voltage value. For example, a voltage monitor signal 120 of 10 volts may correspond to a driver voltage 124 of 1000 volts, although any ratio of voltage monitor signal to driver voltage may be provided by the power amplifier 102 as the voltage monitor signal 120. In general, the voltage monitor 120 is provided for monitoring the output voltage 124 from the power amplifier 102 so adjustments may be made at the control input 118 for precision control of the movement of the piezoelectric actuator 104.

The power amplifier 102 may also provide a current monitor 122 signal that corresponds to the current provided by the power amplifier 102 to the piezoelectric actuator 104. To provide the current monitor 122, the power amplifier 102 may include an ammeter 126 or similar device in the output 124 of the power amplifier that provides the current of the output signal 124. The current monitor 122 may provide the measured current of the output signal 124 or may be a fraction of or otherwise correspond to the measured current of the output signal. For example, the power amplifier 102 may include a current dividing circuit to step-down the current measurement of the output signal 124. In addition, the current monitor signal 122 may include a voltage value that corresponds to the current of the driver signal 124. For example, a current monitor signal 122 of 1 volt may correspond to 10 ma of current in the driver signal 124 and a current monitor signal of 10 volts may correspond to 100 ma of current. In general, any ratio of voltage level to measured current may be provided in the current monitor signal 122.

The piezoelectric actuator 104 of the circuit 100 may include a piezoelectric material disposed between two conducting plates. A representation of the physical actuator 112 that is moved in response to the driving signal 124 is illustrated in the circuit 100, although the piezoelectric actuator may include any number of components. An electrical equivalent circuit 104 of the piezoelectric actuator is also illustrated for discussion purposes herein. In particular, the piezoelectric actuator 104 may exhibit electrical properties similar to a capacitor 114 ($C_1$) connected in parallel with a resistor 116 ($R_1$) between the driver signal 124 and a ground or common, as illustrated in FIG. 1A.

As discussed above, the piezoelectric actuator 104 may exhibit a hysteresis effect during expansion and contraction of the piezoelectric material. FIG. 1B is a graph 150 illustrating displacement 154 versus input voltage 152 of the piezoelectric actuator 104 of FIG. 1A. In general, hysteresis is the dependence of the state of the material based on the history of deformation of material. As shown in the graph 150, the displacement 154 of the material at a voltage near the middle of the input voltage range may vary significantly depending on whether the material is expanding (line 156) or relaxing (compressing) (line 158). In systems that require a precise control over the piezoelectric actuator 104, such a hysteresis effect may be undesirable as the resulting linear displacement of the material may be different for the same input control 118 signal, depending on whether the displacement was reached moving along one (156) or the other curve (158).

In some instances, a power amplifier or driver of a piezoelectric actuator may utilize a charge feedback circuit to reduce the nonlinear hysteresis effect. For example, FIG. 2A is an example voltage amplifier driver circuit 200 for a piezoelectric actuator 204 with a floating-load charge feedback 226 portion. Several of the components of the circuit 200 of FIG. 2A are similar to that described above with reference to FIG. 1A, including a power amplifier circuit 202 driving a piezoelectric actuator 204. The power amplifier 202 may amplify an input control signal 218 to an actuator driving signal 224. In one example, the control input may range from 0 to 10 volts to generate a driving signal 224 of 0 volts to 1000 volts, although any amplification or gain of the control input may be generated by the amplifier 202. The power amplifier 202 may also provide a voltage monitor signal 120 and current monitor signal 122, as described above in FIG. 1A. The internal components and connections of the power amplifier 202 are not illustrated in FIG. 2A for simplicity, but one example of the power amplifier is illustrated in FIG. 1A.

The piezoelectric actuator 204 of circuit 200 is also similar to that described above and may include a physical actuator 212 that moves in response to the driving signal 224. The electrical equivalent of the piezoelectric actuator 204 is also illustrated as the parallel connection of capacitor $C_1$ 214 and resistor $R_{1A}$ 216. In the circuit 200 of FIG. 2A, however, the piezoelectric actuator 204 may not be connected to ground. Rather, the piezoelectric actuator 204 may be connected within capacitive and resistive divider circuits feeding back to the power amplifier 202 through charge feedback loop 226. In particular, capacitor $C_2$ 208 may be connected between the piezoelectric actuator 204 and ground create a capacitor divider circuit with the capacitor $C_1$ 214 of the piezoelectric actuator 204. The capacitor divider signal fed back to the power amplifier 202 by charge feedback loop 226 may drive the voltage necessary to the piezoelectric actuator 204 to maintain the charge value of the actuator. One potential limitation to the capacitor divider feedback as shown in circuit 200, however, is current leakage due to the resistance $R_{1A}$ 216 of the piezoelectric actuator 204 adding (or subtracting) to the charge value of the feedback capacitor $C_2$ 208. This may result in the voltage and displacement of the actuator 204 to "drift" either to the maximum or minimum values depending on the value of the leakage current within capacitor $C_2$ 208. Similar methods of charge control by regulating current may also have a limitation in that, when a constant displacement point is required equating to a DC voltage across the piezoelectric actuator 204, the equivalent current value is zero. This may result in an indeterminate state for the power amplifier 202 and cause the voltage and displacement to "drift" either to the maximum or minimum values.

One solution to address the drift effect of the capacitor divider circuit is to add an additional resistive feedback network in parallel with the capacitive network, as illustrated in the circuit 200 of FIG. 2A. In particular, resistor $R_{1B}$ 206 is connected in parallel to the piezoelectric actuator 204 and resistor $R_2$ 210 is connected in parallel to capacitor $C_2$ 208 to provide a voltage divider circuit in parallel to the charge divider circuit of capacitor $C_1$ 214 and capacitor $C_2$ 208. Resistor $R_{1A}$ 216 of the piezoelectric actuator 204 and resistor $R_{1B}$ 206 include one portion of the voltage divider circuit, with resistor $R_2$ 210 and $C_2$ 208 including the other portion. In general, the divide ratio of the voltage divider portion of the circuit 200 equals the gain ratio of the power amplifier 202 over 1 (e.g., 1/gain). For example, the voltage divider for the charge feedback loop signal 226 in a circuit with a power amplifier 202 with a gain of 100 (amplifying a 10 volt control input 218 to a 1000 volt driving signal 224) may provide a divide ratio of 100 (dividing the driving signal 224 of 1000 volts to a 10 volt feedback signal 226 back to the power amplifier 202).

The circuit 200 of FIG. 2A may be known as a "floating-load charge drive circuit" and may be used to address the drift and hysteresis effects noted above in piezoelectric actuators 204. The effect of the floating-load charge drive circuit of circuit 200 is shown in the graph 250 of FIG. 2B illustrating input voltage 252 versus displacement 254 for the actuator 204 in the circuit 200. As shown and in comparison to the graph 150 of FIG. 1B, the range of displacement 254 at any input voltage may be significantly less when connecting the piezoelectric actuator to the floating-load charge drive circuit such that a more precise control over the actuator is provided.

In general, the circuit 200 employs a four-part divider circuit ($R_1//C_1$ in series with $R_2//C_2$) providing a divide ratio feedback signal 226 to the amplifier 202 (with $R_1=R_{1A}//R_{1B}$). The error correction in the response of the circuit 200 occurs because capacitor $C_1$ 214 is the equivalent capacitance of the piezoelectric actuator 204 as well as a portion of the upper divider circuit ($R_1//C_1$). The advantage is the piezoelectric equivalent capacitance $C_1$ 214 and resistance $R_{1A}$ 216 changes with the hysteresis error providing the feedback signal 226 to correct for the error. In some instances, values for $R_{1B}$ 206, $R_2$ 210, and $C_2$ 208 may be selected to give a compensated ratio to the feedback signal 226, such as providing a voltage divide ratio equal to the gain of the power amplifier 202 and critically compensated by $R_1*C_1=R_2*C_2$.

Although more precise control over the piezoelectric actuator 204 is gained through the floating-load charge drive circuit 200, it is possible for the circuit to have sub optimal performance. For example, connecting the charge control components (capacitor $C_2$ 208, resistor $R_{1B}$ 206 and resistor $R_2$ 210) to the piezoelectric actuator 204 may be challenging in some implementations. In particular, the power amplifier 202 device may be manufactured and sold separately from devices that utilize the piezoelectric actuator. In the example of a microscope device, a piezoelectric actuator 204 may be embedded within the microscope to shape and bend a reflective surface. A separate power amplifier 202 may be connected to the microscope through a power input to provide the driving signal 224 to control the piezoelectric actuator 204. To connect the floating-load charge drive circuit portion of FIG. 2A to the piezoelectric actuator of the microscope, a user may be required to access the piezoelectric actuator of the device and connect the additional components in parallel to the piezoelectric actuator. In delicate or sensitive environments or devices, such access to and alteration of the device may not be possible. In still another example, the floating-load charge drive circuit may consume large amounts of the power provided by the power amplifier 202. For example, assume a feedback voltage of 10 volts is used in the charge feedback loop 226 to match a control input 218 voltage of 10 volts. In some implementations, the driving signal 224 may be as high as 1000 volts based on the control input signal 218 of 10 volts. In such cases, the floating-load charge drive circuit may dissipate as much as 10 watts of power through resistor $R_{1A}$ 216 and/or resistor $R_{1B}$ 206 to provide the matching feedback voltage of 10 volts. The power amplifier 204 may thus provide additional power that is ultimately dissipated by the floating-load charge drive circuit.

Figure 3:
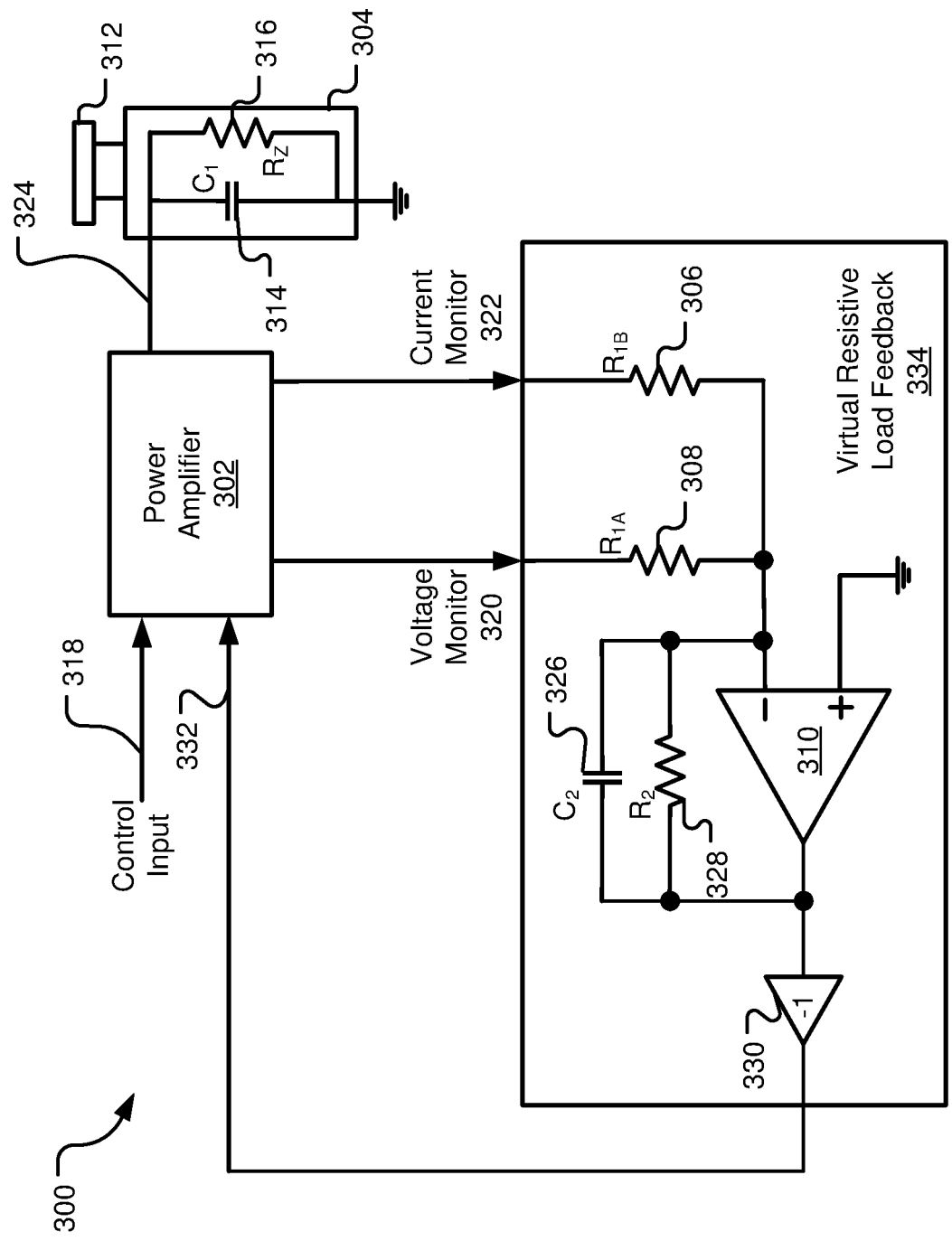
FIG. 3 is a third example voltage amplifier driver circuit for a piezoelectric actuator with a virtual resistive load feedback.

FIG. 3 illustrates a voltage amplifier driver circuit 300 for a piezoelectric actuator 304 utilizing a virtual resistive load feedback 334 to account for hysteresis and drift effects of the piezoelectric actuator. The virtual resistive load feedback 334 of the driver circuit 300 may provide a charge feedback discussed above to address the hysteresis and drift effects of driving a piezoelectric actuator 304 without a large power consumption and without the floating the actuator by connecting components between the piezoelectric actuator and ground, as illustrated in the circuit 200 of FIG. 2A. Thus, the virtual resistive load feedback 334 simplifies the connections for the piezoelectric actuator 304 allowing the actuator to be at ground potential, reducing power loss, and gaining the improved voltage to distance response that the floating-load charge drive circuit provides.

The circuit of FIG. 3 may include a power amplifier 302 to amplify an input control signal 318 to an actuator driving signal 324. In one example, the control input 318 may range from 0 to 10 volts to generate a driving signal 324 of 0 volts to 1000 volts, although any amplification of the control input may be generated by the amplifier 302. The power amplifier 302 may provide a voltage monitor signal 320 and current monitor signal 322. The voltage monitor signal 320 may be a monitor signal generated by the power amplifier 302 to monitor the output of the amplifier and generally corresponds to the gain ratio of the power amplifier 302. In one example, the voltage monitor signal 320 may be in the range of 0 to 10 volts to correspond to a driving voltage range 0 to 1000 volts, such that a monitor voltage of 0 volts corresponds to a driving voltage of 0 volts, a monitor voltage of 5 volts corresponds to a 500 volt driving signal, and a monitor voltage of 10 volts corresponds to a driving voltage of 1000 volts. Any ratio between the voltage of the driving signal 324 and the monitor signal 320 may be provided, however.

The power amplifier 302 may also provide a current monitor signal 322 that corresponds to a current of the driving signal 324 to monitor the current output of the amplifier. The voltage of the current monitor signal 322 corresponds to the current of the driving signal 324 through a ratio of provided current to voltage of current monitor signal. In one example, the current monitor signal 322 may be in the range of 0 to 10 volts to correspond to a current range of 0 ma to 10 ma of current, such that a monitor voltage of 0 volts corresponds to a driving current of 0 ma, a monitor voltage of 5 volts corresponds to a driving signal current of 5 ma, and a monitor voltage of 10 volts corresponds to a driving current of 10 ma. Any ratio between the current of the driving signal 324 and the current monitor signal 322 may be provided. The internal components and connections of the power amplifier 302 are not illustrated in FIG. 3 for simplicity, but one example of the power amplifier is illustrated in FIG. 1A and described above.

The piezoelectric actuator 304 of circuit 300 may include a physical actuator 312 that moves in response to the application of the driving signal 324 to a piezoelectric material. The electrical equivalent of the piezoelectric actuator 304 is also illustrated as the parallel connection of capacitor $C_1$ 314 and resistor $R_z$ 316. The piezoelectric actuator 304 of circuit 300 is connected to ground and is therefore not floating.

To provide a charge divided ratio signal that address hysteresis and drift, the circuit 300 includes a virtual resistive load feedback circuit 334 that takes advantage of the equivalent circuit characteristics of the piezoelectric actuator 304 as part of the closed control loop, similar to the charge feedback in the floating-load charge drive circuit 200 above with the impedance of the piezoelectric actuator as part of the feedback. In particular, the virtual resistive load feedback circuit 334 may include an inverting adder or summing operational amplifier 310 with a first input, a second input, and an output. The output of the operational amplifier 310 is feedback through a resistor $R_2$ 328 and capacitor $C_2$ 326 connected in parallel to the first input of the operational amplifier. The second input of the amplifier 310 may be connected to ground or common. The voltage monitor signal 320 and the current monitor signal 322 from the power amplifier 302 discussed above may also couple to the first input of the operational amplifier 310 through resistor $R_{1A}$ 308 and resistor $R_{1B}$ 306. The output of the operational amplifier 310 may also couple to an input of an inverter 330, the output of which is provided to the power amplifier 302 driving the piezoelectric actuator 304 to complete the feedback loop to the power amplifier. More or fewer components may be included in the virtual resistive load feedback circuit 334 such that the circuit of FIG. 3 is but one example of such a circuit.

In operation, capacitor $C_2$ 326 and resistor $R_2$ 328 may be utilized similar to capacitor $C_2$ 208 and resistor $R_2$ 210 of the floating load charge drive circuit 200 of FIG. 2. However, in this configuration, capacitor $C_2$ 326 and resistor $R_2$ 328 are placed around the feedback path of the operational amplifier 310 of the virtual resistive load feedback circuit 334 instead of between ground and the low end of the piezoelectric actuator 304. Thus, the resistor and capacitor components need not be connected between the low end of the piezoelectric actuator 304 and the common return to the ground potential. Further, the values of resistor $R_{1A}$ 308 and resistor $R_{1B}$ 306 of the virtual resistive load feedback circuit 334 may be controlled or selected to generate the same voltage division ratio as the floating-load charge drive circuit, while reducing the power consumption of the selected resistors, as explained in more detail below.

Figure 4:
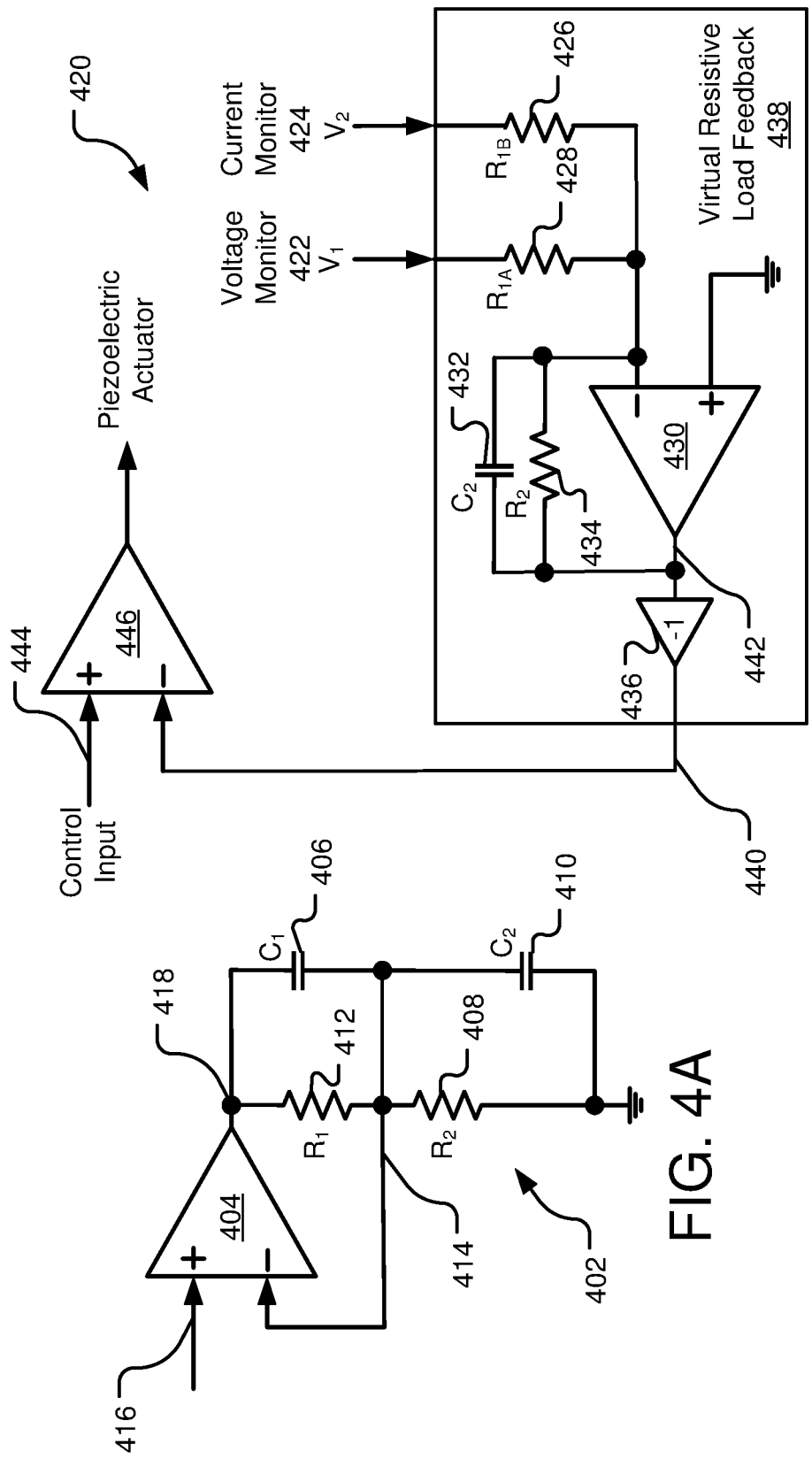
FIG. 4A is an equivalent voltage amplifier driver circuit for a piezoelectric actuator with a floating-load charge feedback.
FIG. 4B is a voltage amplifier driver circuit for a piezoelectric actuator with a virtual resistive load feedback.

The general operation of the virtual resistive load feedback 334 to provide the feedback characteristics to address the hysteresis and drift effects is discussed with reference to FIG. 4A and FIG. 4B. In particular, FIG. 4A is a feedback portion of a voltage amplifier driver circuit for a piezoelectric actuator with a floating-load charge feedback and FIG. 4B is a voltage amplifier driver for a piezoelectric actuator with a virtual resistive load feedback portion. The circuit portion 402 of FIG. 4A may correspond to the circuit 200 of FIG. 2A such that resistor $R_1$ 406 of FIG. 4A corresponds to resistor $R_{1A}$ 216 plus resistor $R_{1B}$ 206 of FIG. 2A and resistor $R_2$ 408 of FIG. 4A corresponds to resistor $R_2$ 210 of FIG. 2A. Similarly, capacitor $C_1$ 406 and capacitor $C_2$ 410 of FIG. 4A correspond to capacitor $C_1$ 214 and capacitor $C_2$ 208 of FIG. 2A, respectively.

The floating-load charge feedback circuit 402 of FIG. 4A may include a voltage divider portion to divides a drive signal to a piezoelectric actuator for a feedback signal 414, as discussed above. The feedback voltage 414 ($V_{FB}$) to the power amplifier 404 may be related to the driving voltage 418 ($V_{DRIVE}$) by:

$$V_{FB} = \left(\frac{R_2}{R_1 + R_2}\right) * V_{Drive} \quad (2)$$

For example, to provide a divide ratio equal to a gain of a power amplifier 404 of 100 and assuming a driving voltage of 1000 volts in response to a control input voltage of 10 volts, resistor $R_1$ 412 may have a value of 99000 ohms and resistor $R_2$ 408 may have a value of 1000 ohms. The feedback voltage in this example is thus $V_{FB}$=(1000/100000)*1000 V=10 volts, matching the control input voltage 416 to the power amplifier 404 used to control the piezoelectric amplifier as described above. Although the power divider circuit 402 of FIG. 4A provides the feedback voltage 414 for the floating-load charge feedback, significant power may be dissipated through resistor $R_1$ 412 by the driving voltage 418. In the particular example above, as much as 10 watts of power may be lost through resistor $R_1$ 412 at a driver signal 418 of 1000 volts to obtain the balanced feedback voltage 414 for the 100 gain amplifier 404.

The virtual resistive load feedback circuit 438 of FIG. 4B, on the other hand, may provide a similar voltage dividing function with less power consumption by the circuit. In particular, because the voltage monitor signal 422 and the current monitor signal 424 operate at a smaller voltage level, the power loss through virtual resistor $R_{1A}$ 428 or resistor $R_{1B}$ 426 may be less than in the above example. In general, voltage monitor signal $V_1$ 422 and current monitor signal $V_2$ 424 are added together by summing operational amplifier 430 of the circuit 438. The gain ratio of the divider circuit equals the value of resistor $R_2$ 434 divided by the virtual resistor $R_1$ created by resistor $R_{1A}$ 428 and resistor $R_{1B}$ 426. For example, the output 442 ($V_O$) of the operational amplifier 430 of the circuit 438 equals:

$$V_O = -R_2\left(\frac{V_1}{R_{1A}} + \frac{V_2}{R_{1B}}\right) \quad (3)$$

Thus, assume voltage monitor signal $V_1$ 422 and current monitor signal $V_2$ 424 are both 10 volts. Keeping resistor $R_2$ 434 at 1000 ohms from the example above and providing a feedback voltage to the power amplifier 446 equal to the control input 444, resistor $R_{1A}$ 428 and resistor $R_{1B}$ 424 may each be set at 2000 ohms to provide a −10 volt output signal 442 from the operational amplifier 430. Inverting the voltage output signal 442 through inverter 436 provides a 10 volt feedback voltage signal 440 to the power amplifier 446 driving the piezoelectric actuator, similar to the floating load feedback circuit above.

In this example, however, the power dissipated through virtual resistor $R_1$ (resistor $R_{1A}$ 428 and resistor $R_{1B}$ 426) is about 0.10 watts. When compared with the power dissipation of resistor $R_1$ 412 in the voltage divider of FIG. 4A of 10 watts, the power consumed in the virtual resistive load feedback circuit 438 of FIG. 4B is significantly less while providing the same voltage ratio feedback signal to the power amplifier 446. Further, using a voltage monitor signal $V_1$ 422 equal to the total voltage measured through the piezoelectric load plus the current monitor signal $V_2$ 424 input representing the equivalent current that any selected parallel resistor would supply, the feedback signal 440 to the power amplifier 446 is based on the electrical characteristics of the piezoelectric actuator without connecting directly to the actuator. In other words, the use of the voltage monitor signal 422 and the current monitor signal 424 may create a virtual resistor corresponding to resistor $R_1$ 412 of the floating load feedback circuit of FIG. 4A. The virtual resistor may affect the feedback circuit as if connected in parallel to the piezoelectric actuator without needing to be directly connected to the actuator itself. The values of the resistors (or other components) of the virtual resistive load feedback circuit 438 may be selected or otherwise tuned, such as through a computing device in some instances, to achieve the same gain ratio as in the voltage divider of FIG. 4A but with less consumed power.

In addition to including the voltage divider portion in the feedback circuit, the virtual resistive load feedback 438 may also include a charge divider portion. For example, the floating load feedback circuit 402 of FIG. 4A illustrates an equivalent circuit of a piezoelectric actuator in the parallel connection of resistor $R_1$ 412 and capacitor $C_1$ 406. As discussed above, a second capacitor $C_2$ 410 and second resistor $R_2$ 408 may be connected in parallel between the low end of the piezoelectric actuator equivalent circuit and ground, with a floating-load charge drive feedback to the power amplifier 404. The circuit 402 of FIG. 4A takes advantage of connecting the piezoelectric actuator itself as part of the feedback signal such that resistor $R_1$ 412 represents an equivalent resistance through the actuator in parallel with an additional resistor. Lower arm resistor $R_2$ 408 in the voltage divider circuit is matched with a corresponding capacitor $C_2$ 410 for alternating current compensation. In general, as frequency signals are introduced to the amplifier 404 by control input 416, the impedance value of capacitor $C_1$ 406 (representing the capacitance of the piezoelectric actuator) is a function of frequency. By adding the matching capacitor $C_2$ 410 in parallel with resistor $R_2$ 408, the voltage ratio or voltage feedback signal 414 remains constant as the frequency of the driving signal 418 changes.

The virtual resistive load feedback circuit 438 of FIG. 4B provides a similar compensation function without connecting components between the piezoelectric actuator and ground. The use of the voltage monitoring signal 422 and the current monitoring signal 424 provided by the high voltage amplifier 446 as described above may be used as the input signal $V_1$ and $V_2$, respectively. $V_1$ 422 represents the voltage of the driving signal to the piezoelectric actuator and the $V_2$ 424 represents the current of the driving signal (represented by a voltage value). $V_1$ 422 and $V_2$ 424 are provided into the summing operational amplifier 430 and may be equivalent to the total current entering into the feedback node 414 as provided by resistor $R_1$ 412 and capacitor $C_1$ 406 of the floating-load charge drive circuit 402 of FIG. 4A. In this manner, the monitor signals 422, 424 provide for the virtual resistance $R_1$ across the piezoelectric actuator while providing the total current through the actuator. To compensate for alternating current signals in the virtual resistive load feedback circuit 438, capacitor $C_2$ 432 is connected in parallel with resistor $R_2$ 434 in the feedback loop of the operational amplifier 430.

In general, the current provided by the current monitor signal 424 equals the current supplied to the piezoelectric actuator. Thus, $V_2/R_{1B}$ equals the current measured through the piezoelectric actuator. For example, assume 10 ma of current is flowing through the piezoelectric actuator. Resistor $R_{1B}$ 426 may be selected with a value of 100 ohms to provide 10 ma of current when the current monitor voltage signal 424 value equals 1 volt for 10 ma current monitor ratio. In this manner, the value of resistor $R_{1B}$ 426 may be selected based on the ratio of measured current in the driving signal to voltage of the current monitor voltage signal 424. Further, the capacitance value of capacitor $C_2$ 432 may be selected given the value of the piezoelectric actuator nominal capacitance value and using the AC compensation formula of (Virtual $R_1$) $(C_1)=(R_2)$ $(C_2)$. If, for example, the piezoelectric nominal capacitance is 10 nf, then the value of $C_2$=1000 nf. The values of resistor $R_2$ 434 and capacitor $C_2$ 432 may be selected accordingly to match an AC compensation formula given the values of $R_1$ and $C_1$. An advantage to the circuit 438 of FIG. 4B is that the dynamic and transient effects can be adjusted without changing the ratio of the feedback. For example, if capacitor $C_2$ 432 is changed to 100 nf, resistor $R_2$ 434, resistor $R_{1A}$ 428, and/or resistor $R_{1B}$ 426 may also be adjusted to maintain the same voltage ratio while still maintaining the compensation formula.

Returning to the circuit 300 of FIG. 3, the virtual resistive load feedback 334 thus uses the voltage monitor 320 and/or current monitor 322 (through resistor $R_{1A}$ 308 and resistor $R_{1B}$ 306) as inputs to the summing junction of the op-amp 310 to create a virtual resistor $R_1$ across the piezoelectric actuator 304. Along with the virtual resistor, resistor $R_2$ 328 and capacitor $C_2$ 326 may be placed in the feedback of an inverting op-amp 310 for AC compensation and voltage division. In response, the dynamic value changes of actuator 304 may compensate for displacement error by the change in the voltage feedback ratio correcting for drift and hysteresis in a piezoelectric actuator motion 304. By using the inverting op-amp 310 and voltage monitor 320 and current monitor 322 in this manner, the piezoelectric actuator 304 can be ground referenced, with no external components connected directly to the actuator. This implementation may provide a more precise control and better accuracy of the piezoelectric actuator 304. When mated with a power amplifier 302 with voltage and current monitoring sources 320, 322 from the amplifier, a low voltage control input signal 318 to the power amplifier 302 may be corrected to compensate for the change in the piezoelectric voltage to displacement transfer function. The amount of change may be adjusted manually or through a computing device as components of the virtual resistive load feedback 334 circuit are low voltage circuit components, providing for precise correction of the feedback signal 332.

Figure 5:
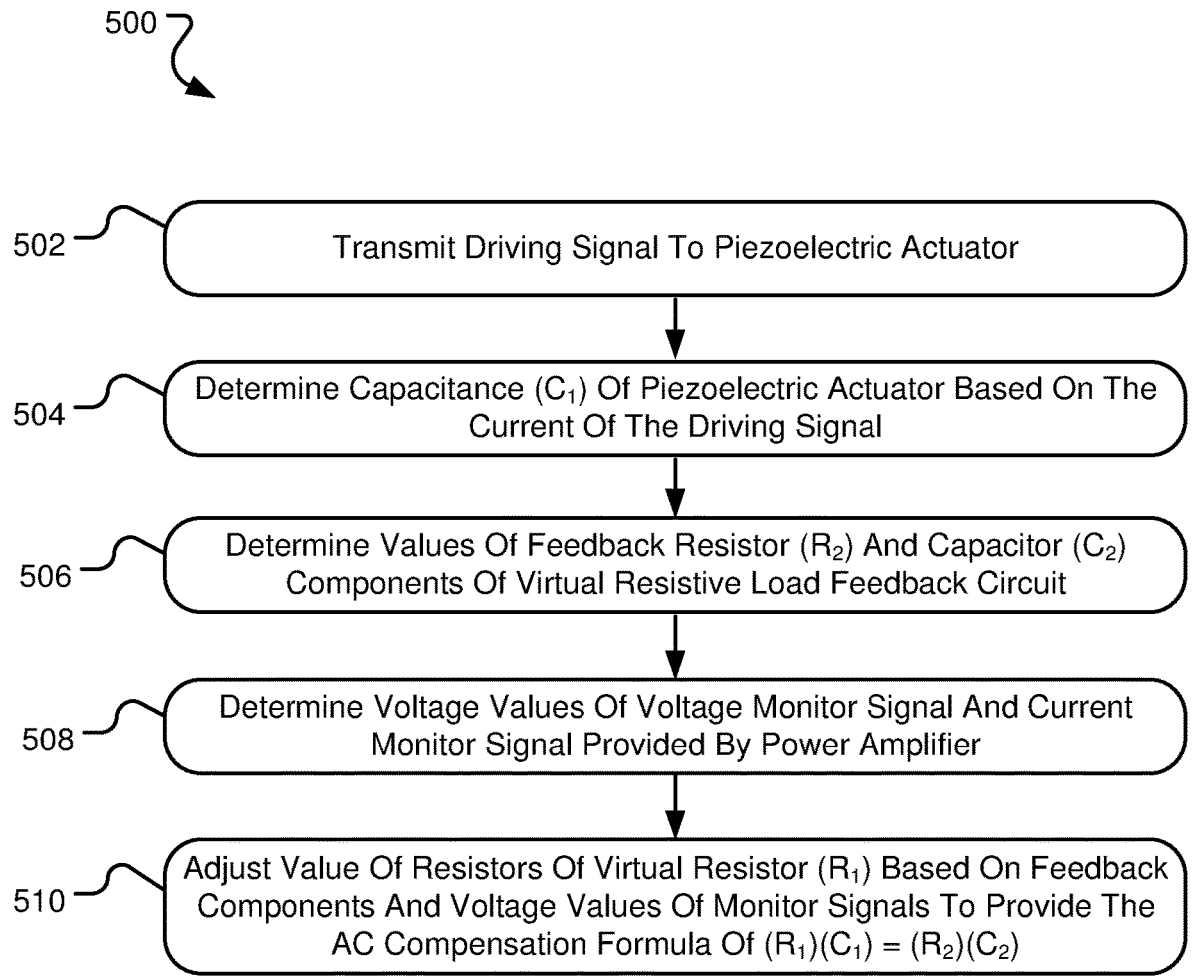
FIG. 5 is a flowchart of a method for selecting resistance values for components of a virtual resistive load feedback circuit.

FIG. 5 is a flowchart of a method for selecting resistance values for components of a virtual resistive load feedback circuit. The operations of the method 500 of FIG. 5 may be performed by a computing device or system described below. The operations may be performed using software-related programs, hardware configured to perform aspects of the operations, or a combination of both software and hardware components.

Beginning in operation 502, a power amplifier 302 provides or transmits a driving signal to a piezoelectric actuator 304. As discussed above, the piezoelectric actuator 304 may have an equivalent capacitance when driven by an AC signal, illustrated in FIG. 3 as capacitor $C_1$ 314. In operation 504, the capacitance of the piezoelectric actuator 304, or capacitor $C_1$ 314 may be determined. For example, the piezoelectric nominal capacitance (or $C_1$ 314 of the piezoelectric actuator 304) may be determined to be 10 nf. The nominal capacitance of the actuator 304 may be measured by the computing device or determined through measurements of other components and characteristics of the circuit 300. In operation 506, the values of feedback resistor $R_2$ 328 and capacitor $C_2$ 326 of the virtual resistive load feedback circuit 334 may be determined. In one implementation, the computing device may determine or receive as an input the resistance value of resistor $R_2$ 328 and the capacitance value of capacitor $C_2$ 326. Continuing the example above, resistor $R_2$ 328 may have a resistor value of 1,000 ohms and capacitor $C_2$ 326 may have a capacitance of 1 uf. The values of R2 328 and C2 326 may vary depending on the implementation of the virtual resistive load feedback circuit 334, the gain of the power amplifier 302, and the electrical characteristics of the piezoelectric actuator 304.

In operation 508, the voltage values of the voltage monitor signal 320 and the current monitor signal 322 provided by the power amplifier 302 may be determined. For example, the voltage monitor signal 320 may correspond to the driver voltage 324 provided by the power amplifier 302. In one instance, a voltage monitor signal 320 of 10 volts corresponds to a 1000 volt driver signal 324, although any gain of the power amplifier 302 may be represented in the voltage monitor signal 320. In a similar manner, the current monitor signal 322 may be a voltage value representation of the current of the driver signal 324 provided to the piezoelectric actuator 304. For example, a 10 volt current monitor signal 322 may represent 10 ma of current of the driver signal 324. In operation 510, the resistance value of virtual resistor $R_1$ may be adjusted through adjustment of resistor $R_{1A}$ 308 and resistor $R_{1B}$ 306 based on the values of the feedback components (resistor $R_2$ 328 and capacitor $C_2$ 326) and the voltage values of current monitor signal 322 and voltage monitor signal 320. In particular, the value of resistor $R_{1A}$ 308 and resistor $R_{1B}$ 306 may be adjusted such that AC compensation formula (Virtual $R_1$) $(C_1)=(R_2)$ $(C_2)$ is satisfied. With the values of resistor $R_2$ 328, capacitor $C_2$ 326, and the nominal capacitance of the piezoelectric actuator 304 $C_1$ known, the value of virtual resistor $R_1$ may be determined. To adjust the resistance value of virtual resistor $R_1$, the resistance values of resistor $R_{1A}$ 308 and resistor $R_{1B}$ 306 based on the known voltage of the voltage monitor signal 320 and the current monitor signal 322 provided by the power amplifier 302. In some instances, the resistance values of resistor $R_{1A}$ 308 and resistor $R_{1B}$ 306 may simply be calculated by the added current of the virtual resistor $R_1$ as sourced by the voltage monitor signal 320 and current monitor signal 322. With the target virtual resistor $R_1$ determined, the resistance values of resistor $R_{1A}$ 308 and resistor $R_{1B}$ 306 may therefore be set. In one instance, resistor $R_{1A}$ 308 and resistor $R_{1B}$ 306 may be tunable resistors that respond to a signal from a computing device, such as that described below, to generate a resistance value indicated in the signal from the computing device. By controlling resistor $R_{1A}$ 308 and resistor $R_{1B}$ 306, the computing device may adjust the resistance of the virtual resistor $R_1$ corresponding to the AC compensation formula for the virtual resistive load feedback 334.

The description above includes example systems, methods, techniques, instruction sequences, and/or computer program products that embody techniques of the present disclosure. However, it is understood that the described disclosure may be practiced without these specific details.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium (e.g., hard disk drive), optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

Figure 6:
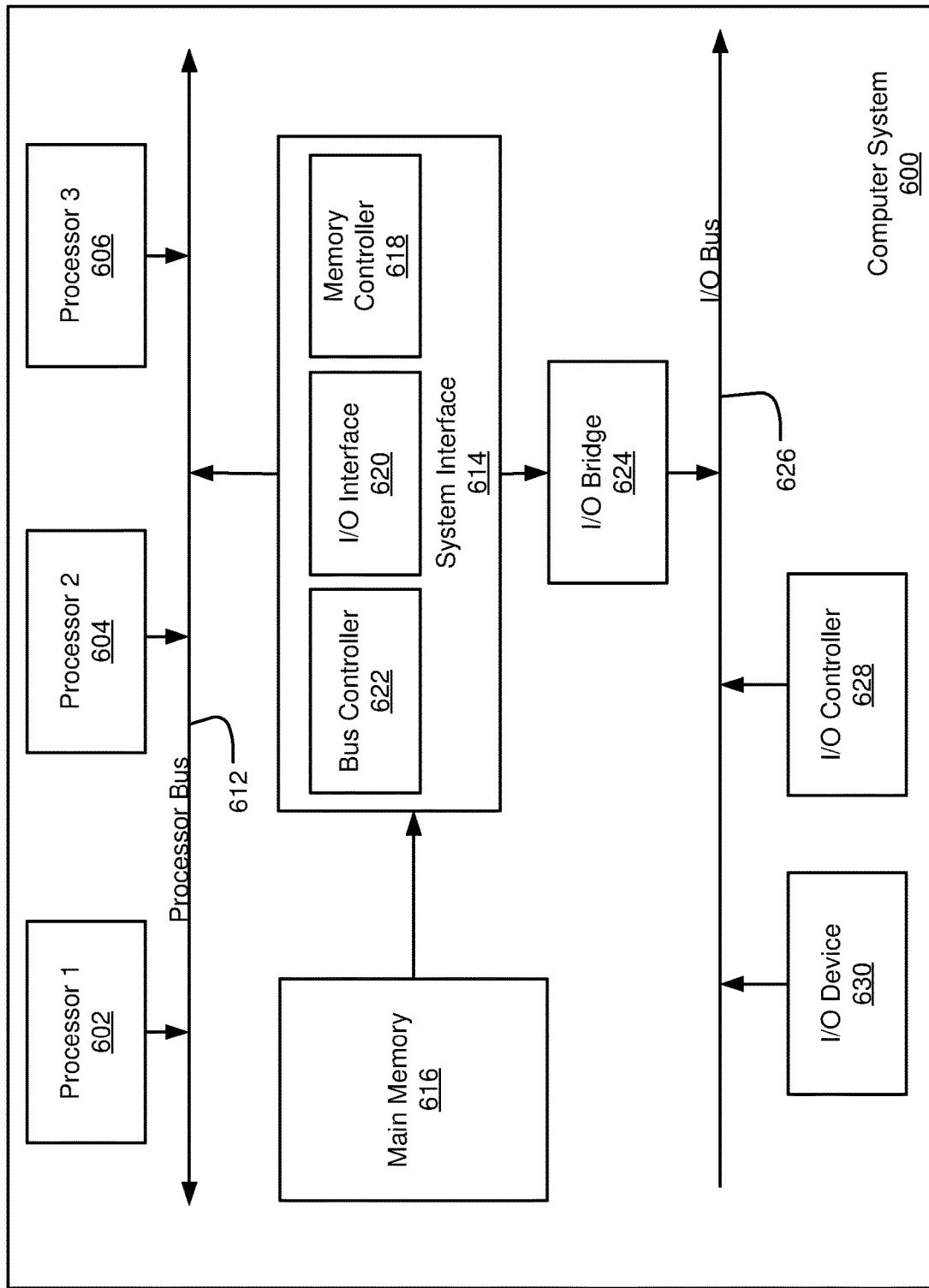
FIG. 6 illustrates an example computer system according to one embodiment of the present disclosure.

For example, FIG. 6 is a block diagram illustrating an example of a host or computer system 600 which may be used in implementing the embodiments of the present disclosure. The computer system (system) includes one or more processors 602-606. Processors 602-606 may include one or more internal levels of cache (not shown) and a bus controller or bus interface unit to direct interaction with the processor bus 612. Processor bus 612, also known as the host bus or the front side bus, may be used to couple the processors 602-606 with the system interface 614. System interface 614 may be connected to the processor bus 612 to interface other components of the system 600 with the processor bus 612. For example, system interface 614 may include a memory controller 613 for interfacing a main memory 616 with the processor bus 612. The main memory 616 typically includes one or more memory cards and a control circuit (not shown). System interface 614 may also include an input/output (I/O) interface 620 to interface one or more I/O bridges or I/O devices with the processor bus 612. One or more I/O controllers and/or I/O devices may be connected with the I/O bus 626, such as I/O controller 628 and I/O device 630, as illustrated.

I/O device 630 may also include an input device (not shown), such as an alphanumeric input device, including alphanumeric and other keys for communicating information and/or command selections to the processors 602-606. Another type of user input device includes cursor control, such as a mouse, a trackball, or cursor direction keys for communicating direction information and command selections to the processors 602-606 and for controlling cursor movement on the display device.

System 600 may include a dynamic storage device, referred to as main memory 616, or a random access memory (RAM) or other computer-readable devices coupled to the processor bus 612 for storing information and instructions to be executed by the processors 602-606. Main memory 616 also may be used for storing temporary variables or other intermediate information during execution of instructions by the processors 602-606. System 600 may include a read only memory (ROM) and/or other static storage device coupled to the processor bus 612 for storing static information and instructions for the processors 602-606. The system set forth in FIG. 6 is but one possible example of a computer system that may employ or be configured in accordance with aspects of the present disclosure.

According to one embodiment, the above techniques may be performed by computer system 600 in response to processor 604 executing one or more sequences of one or more instructions contained in main memory 616. These instructions may be read into main memory 616 from another machine-readable medium, such as a storage device. Execution of the sequences of instructions contained in main memory 616 may cause processors 602-606 to perform the process steps described herein. In alternative embodiments, circuitry may be used in place of or in combination with the software instructions. Thus, embodiments of the present disclosure may include both hardware and software components.

A computer readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 616. Common forms of machine-readable medium may include, but is not limited to, magnetic storage medium (e.g., hard disk drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A piezoelectric power amplifier comprising:
an amplifier comprising a first input and a second input, the first input receiving a control input signal and the amplifier transmitting, based on the control input signal, a power driving signal to a piezoelectric actuator device; and
a hysteresis compensation circuit comprising:
a summing circuit comprising a first input receiving a voltage monitor signal comprising a first voltage value corresponding to a voltage of the power driving signal and a current monitor signal comprising a second voltage value corresponding to a current of the power driving signal, the output comprising the sum of the voltage monitor signal and the current monitor signal; and
a dividing circuit, coupled between the output of the summing circuit and the first input of the summing circuit, wherein the output of the summing circuit is coupled to the second input of the amplifier for hysteresis compensation of the piezoelectric actuator device based at least on the voltage monitor output signal and the current monitor output signal.

2. The piezoelectric power amplifier of claim 1, wherein the summing circuit comprises:
an operational amplifier comprising the first input, a second input, and the output, the second input of the operational amplifier coupled to common and the output of the operational amplifier coupled to an input of an inverter device, an output of the inverter device coupled to the second input of the amplifier.

3. The piezoelectric power amplifier of claim 1, wherein the dividing circuit comprises: a first resistor connected in parallel with a capacitor.

4. The piezoelectric power amplifier of claim 3, wherein the dividing circuit divides a current of the power driving signal based at least on the capacitor and an electrical capacitance of the piezoelectric actuator device.

5. The piezoelectric power amplifier of claim 3, wherein the hysteresis compensation circuit further comprises:
a first tunable resistor coupled in series between the voltage monitor output signal and the first input of the summing circuit; and
a second tunable resistor coupled in series between the current monitor output signal and the first input of the summing circuit.

6. The piezoelectric power amplifier of claim 5, wherein the first tunable resistor and the second tunable resistor generate a virtual resistance across the piezoelectric actuator device, the hysteresis compensation circuit further comprising:

a voltage divider circuit dividing the voltage of the power driving signal based on the virtual resistor and the first resistor.

7. The piezoelectric power amplifier of claim 5, further comprising:
a computing device coupled to the first tunable resistor and the second tunable resistor, the computing device to control a resistive value of the first tunable resistor and the second tunable resistor.

8. The piezoelectric power amplifier of claim 7, wherein the control of the resistive value of the first tunable resistor and the second tunable resistor is based on a ratio of a resistive value of the virtual resistor to a capacitance value of an electrical capacitance of the piezoelectric actuator device.

9. A system for hysteresis compensation of a piezoelectric actuator, the system comprising:
an operational amplifier comprising:
a first input receiving a voltage monitor signal of a power amplifier and a current monitor signal of the power amplifier, the power amplifier receiving a control input signal and providing a power driving signal to a load, the voltage monitor signal comprising a first voltage value corresponding to a voltage of the power driving signal and the current monitor signal comprising a second voltage value corresponding to a current of the power driving signal;
a second input coupled to a common value; and
an output coupled to a feedback input of the power amplifier, the output comprising a summation of the voltage monitor signal and the current monitor signal; and
a feedback circuit, coupled between the output of the operational amplifier and the first input, comprising a first resistor connected in parallel with a capacitor, the feedback circuit dividing the voltage and the current of the power driving signal.

10. The system of claim 9, further comprising:
a first tunable resistor coupled in series between the voltage monitor output signal and the first input of the operational amplifier; and
a second tunable resistor coupled in series between the current monitor output signal and the first input of the operational amplifier.

11. The system of claim 10, further comprising:
a computing device coupled to the first tunable resistor and the second tunable resistor, the computing device to control a resistive value of the first tunable resistor and the second tunable resistor.

12. The system of claim 10, wherein the first tunable resistor and the second tunable resistor generate a virtual resistance across the load such that a voltage of the output of the operational amplifier is based on the voltage of the power driving signal multiplied by a ratio of a resistance value of the virtual resistor and a resistance value of the first resistor.

13. The system of claim 9, wherein the current of the output of the operational amplifier is the current of the power driving signal multiplied by a divide ratio based on an equivalent capacitance of the load and the capacitor of the feedback circuit.

* * * * *